(12) United States Patent
Sorabji

(10) Patent No.: US 10,076,896 B2
(45) Date of Patent: Sep. 18, 2018

(54) PRESSURIZED HEATED ROLLING PRESS FOR MANUFACTURE AND METHOD OF USE

(71) Applicant: Alta Devices, Inc., Sunnyvale, CA (US)

(72) Inventor: Khurshed Sorabji, San Jose, CA (US)

(73) Assignee: ALTA DEVICES, INC., Sunnyvale, CA (US)

(*) Notice: Subject to any disclaimer, the term of this patent is extended or adjusted under 35 U.S.C. 154(b) by 45 days.

(21) Appl. No.: 15/191,410

(22) Filed: Jun. 23, 2016

(65) Prior Publication Data

US 2016/0375671 A1    Dec. 29, 2016

Related U.S. Application Data

(60) Provisional application No. 62/184,712, filed on Jun. 25, 2015.

(51) Int. Cl.
   *B32B 37/10*    (2006.01)
   *H01L 21/677*   (2006.01)
   (Continued)

(52) U.S. Cl.
   CPC .......... *B32B 37/1018* (2013.01); *B32B 37/06* (2013.01); *B32B 37/1027* (2013.01);
   (Continued)

(58) Field of Classification Search
   CPC . B32B 37/1018; B32B 38/1858; B32B 37/14; B32B 37/06; B32B 37/1027;
   (Continued)

(56) References Cited

U.S. PATENT DOCUMENTS

| 3,945,789 A | 3/1976 | Boman |
| 6,159,763 A * | 12/2000 | Sakai ............... H01L 31/206 |
| | | 257/E21.101 |

(Continued)

FOREIGN PATENT DOCUMENTS

| EP | 0031724 A2 | 7/1981 |
| EP | 0031724 A2 | 7/1981 |

(Continued)

OTHER PUBLICATIONS

Written Opinion of the International Preliminary Examining Authority issued in International Patent Application No. PCT/US2016/039417, dated May 22, 2017 (7 pages).

(Continued)

*Primary Examiner* — Michael N Orlando
*Assistant Examiner* — Cynthia L Schaller
(74) *Attorney, Agent, or Firm* — Arent Fox LLP

(57) ABSTRACT

A method and system for connecting a plurality of materials using pressure and curing is disclosed. The method provides for: a) receiving the plurality of materials on the vacuum conveyor; b) conveying the received plurality of materials from the first location to a second location along the vacuum conveyor; c) applying a predetermined vacuum pressure; and d) curing the compressed plurality of materials. The system comprises a vacuum conveyor for receiving the plurality of materials at a first location, a moving belt adaptively positioned above the vacuum conveyor at a second location and the vacuum conveyor and the moving belt are arranged to be driven in a predetermined relation to one another, a vacuum pressure source for applying a predetermined vacuum pressure creating a force compressing the plurality of materials; and a curing source at a second location for curing the compressed plurality of materials.

44 Claims, 6 Drawing Sheets

(51) Int. Cl.
*H01L 31/18* (2006.01)
*B32B 37/06* (2006.01)
*B32B 37/14* (2006.01)
*B32B 38/18* (2006.01)

(52) U.S. Cl.
CPC .......... *B32B 37/14* (2013.01); *B32B 38/1858* (2013.01); *H01L 21/677* (2013.01); *H01L 21/6776* (2013.01); *H01L 21/67706* (2013.01); *H01L 21/67748* (2013.01); *H01L 31/1864* (2013.01); *H01L 31/1876* (2013.01); *B32B 2457/12* (2013.01)

(58) Field of Classification Search
CPC ............. B32B 2457/12; H01L 31/1864; H01L 31/1876; H01L 21/67706; H01L 21/6776; H01L 21/677; H01L 21/67748
See application file for complete search history.

(56) References Cited

U.S. PATENT DOCUMENTS

| | | | |
|---|---|---|---|
| 7,004,309 | B2 | 2/2006 | Sherwood |
| 9,356,184 | B2* | 5/2016 | Morad ................ H01L 31/1876 |
| 2008/0081178 | A1 | 4/2008 | Hinotsu et al. |
| 2011/0111173 | A1 | 5/2011 | Ogawa et al. |
| 2012/0067701 | A1 | 3/2012 | Steffen |
| 2012/0118493 | A1 | 5/2012 | Kalkanoglu et al. |
| 2013/0171757 | A1* | 7/2013 | Ponnekanti ............. H01L 31/18 438/57 |
| 2013/0206213 | A1 | 8/2013 | He et al. |
| 2016/0380125 | A1* | 12/2016 | Snaith ................. H01L 51/4213 136/256 |

FOREIGN PATENT DOCUMENTS

| | | |
|---|---|---|
| EP | 1644989 | 4/2012 |
| EP | 1644989 B9 | 4/2012 |
| JP | 2006/120998 A | 5/2006 |
| JP | 2006120998 A | 5/2006 |
| WO | 2014046810 A1 | 3/2014 |
| WO | WO 2014/046810 A1 | 3/2014 |

OTHER PUBLICATIONS

International Search Report and Written Opinion issued in International Patent Application No. PCT/US2016/039417 dated Oct. 24, 2016, total 12 pages.
International Search Report and Written Opinion issued in International Patent Application No. PCT/US2016/039417 dated Oct. 24, 2016, 12 pages.
International Search Report and Written Opinion issued in International Patent Application No. PCT/US2016/039411 dated Jan. 12, 2017, 10 pages.

* cited by examiner

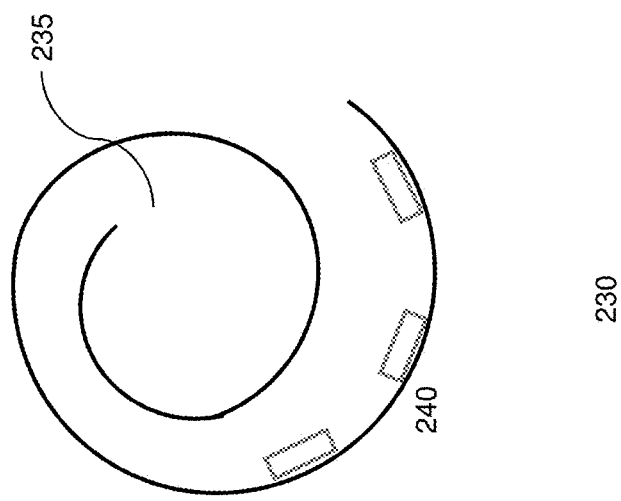
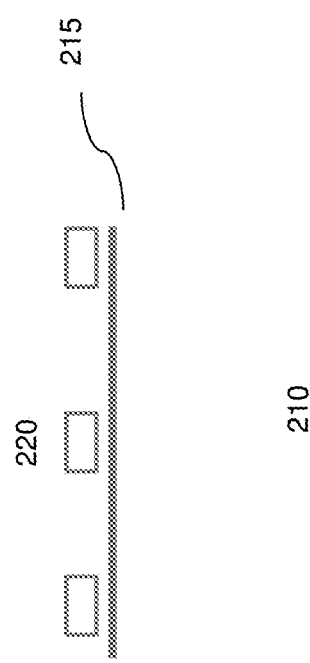
FIGURE 2B
FIGURE 2A

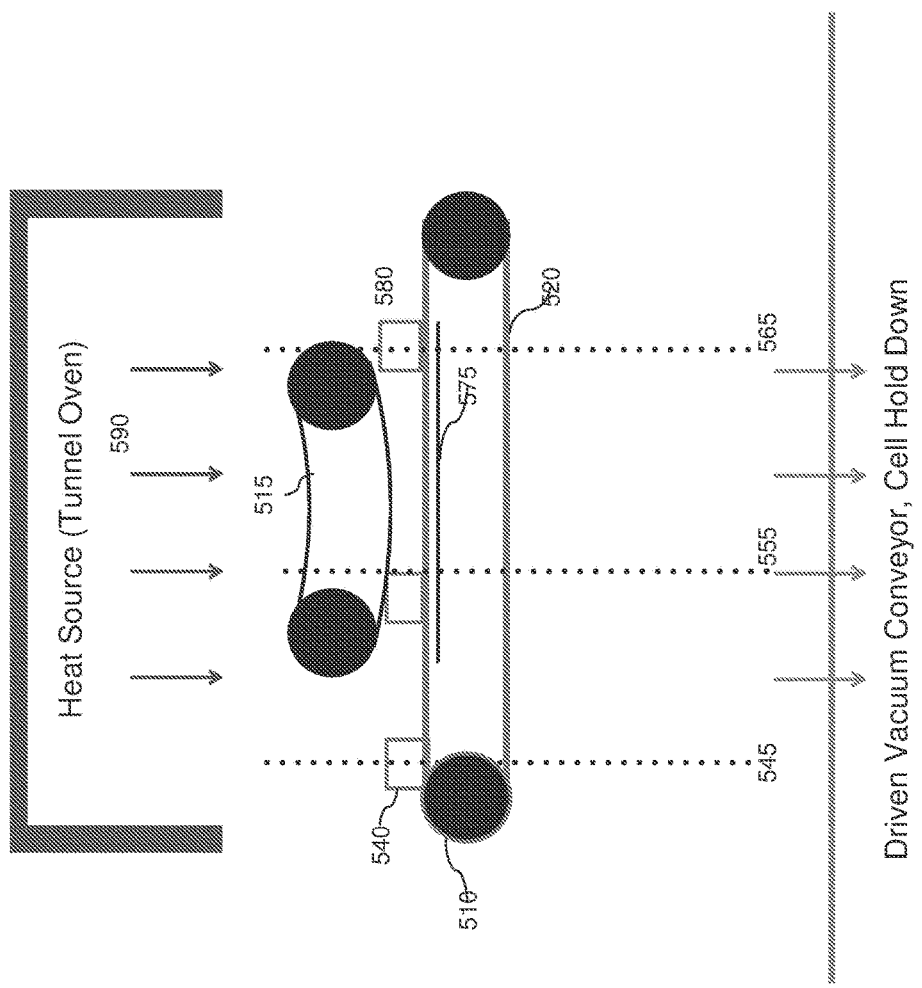

PRESSURIZED HEATED ROLLING PRESS FOR MANUFACTURE AND METHOD OF USE

CROSS-REFERENCE TO RELATED APPLICATION

This application claims benefit under 35 USC 119(e) of U.S. Provisional Patent Application No. 62/184,712, filed on Jun. 25, 2015, entitled "PRESSURIZED HEATED ROLLING PRESS FOR MANUFACTURE AND METHOD OF USE," which is incorporated herein by reference in its entirety.

This application is related to co-owned and co-pending U.S. patent application entitled "PRESSURIZED HEATED ROLLING PRESS FOR MANUFACTURE AND METHOD OF USE," filed on Jun. 23, 2016 as U.S. patent application Ser. No. 15/191,375.

FIELD OF THE INVENTION

The present invention relates generally to manufacturing techniques involving assemblies and more particularly to an improved method of manufacture for assembly including higher-yielding cell feeders, a pressure-controlled thermal treatment process and apparatus, and an improved assembly process for a high throughput system.

BACKGROUND OF THE INVENTION

Manufacturing processes which involve the assembly of components can be performed manually, automatically, or in combination, often in relation to the complexity of the manufacturing process. For instance, assembly processes that press a first component to a second component in a gluing operation often require compression resulting from force on the first component to the second component where an adhesive is affixed in advance in between. The steps involved in this basic assembly process can be simple or complex, in relation to the sensitivity, characteristics and nature of the components as well as the environment of the process itself. One method may involve a manual effort using a hand-guided light touch to press a first component onto the second to ensure that neither component is damaged based upon the experience of the operator manually performing the process. Another method may involve an automated robot device that is able to lift a first component from a tray and then align the first component over a second component having an adhesive coating, and press the first component onto the second component in relation to a control algorithm. Manual processes are often more difficult in environments that are caustic and high temperature, and often automated processes are difficult in processes that have delicate or sensitive components involved. Similarly, manual processes often are lower yield producing for higher-value components and automated processes having higher yields are often for lower-valued components. What is desired is an improvement to manufacturing processes that may produce higher yields of assembly where the assemblies include higher-valued and often sensitive components.

Often in the manufacturing of photovoltaic solar cells and photovoltaic solar cell components into photovoltaic devices such as solar mats, multiple laminate layers are applied to a carrier plate where both the contact and alignment are required to be precise and within particular pressure ranges as the components for example, solar cells are sensitive such that they may be easily broken or damaged during manufacture. As a result, often portions of assembly are manual with lower yields. Additionally, certain follow-on steps of the assembly process often involve high temperatures for curing the cell assemblies in which manual involvement may be dangerous or in some situations, impossible. As yields are sought to be improved, often more automated approaches are introduced which then create additional breakage or damage to the components during assembly, or in other situations, require additional steps to the existing processes which do not substantially reduce the processing times. With demand for photovoltaic cells increasing and the utility of the cells being incorporated into more commercial opportunities in varied markets worldwide, there is a need for improvements to the standard manufacturing assembly processes, in the photovoltaic cell area as well as other assembly areas, to improve the yield without increasing damage to sensitive components, to reduce the risks to those involved in the manual processes while incorporating an approach having a 'lighter-touch" in the assembly process, and to reduce the time to process steps in the assembly, safely.

SUMMARY OF THE INVENTION

A method and system for connecting a plurality of materials using pressure and curing is provided.

In one embodiment, a system for connecting a plurality of materials using pressure and curing comprises a flexible component feeder source for providing plurality of materials at first location; a vacuum conveyor for receiving the plurality of materials at the first location wherein the vacuum conveyor includes a plurality of openings for a predetermined vacuum to hold the plurality of materials in place on the vacuum conveyor; a moving belt is adaptively positioned above the vacuum conveyor at a second location and the vacuum conveyor and the moving belt are arranged to be driven in a predetermined relation to one another for conveying the received plurality of materials from the first location to a second location along the vacuum conveyor; a vacuum pressure source for applying a predetermined vacuum pressure from at least one of the plurality of openings towards the moving belt and the vacuum conveyor as the plurality of materials are conveyed from the second location to a third location, creating a force compressing the plurality of materials; and a curing source at a second location for curing the compressed plurality of materials.

In an embodiment, a method for connecting a plurality of materials using pressure and curing comprises receiving the plurality of materials on the vacuum conveyor at a first location wherein the vacuum conveyor includes a plurality of openings for a predetermined vacuum pressure to hold the plurality of materials in place on the vacuum conveyor; conveying the received plurality of materials from the first location to a second location along the vacuum conveyor, where a moving belt is adaptively positioned above the vacuum conveyor at the second location and the vacuum conveyor and the moving belt are arranged to be driven in a predetermined relation to one another; and applying a predetermined vacuum pressure from at least one of the plurality of openings towards the moving belt and the vacuum conveyor as the plurality of materials are conveyed from the second location to a third location, creating a force compressing the plurality of materials; and curing the compressed plurality of materials.

In a further embodiment, a flexible component feeder source comprising a flexible base suitable for protecting and receiving one or more photovoltaic cells for processing is provided. The feeder source, in a preferred embodiment, includes a base having a linear shape when opened and forms a roll when rolled.

BRIEF DESCRIPTION OF THE SEVERAL VIEWS OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIGS. 2A and 2B diagram a flexible tape feeder having a plurality of photovoltaic cells in accordance with one or more embodiments of the present invention.

FIG. 5 diagrams a vacuum conveyor and a moving belt in relational arrangement when under pressure from a vacuum source such as a vacuum pump creating a downward pressure, in accordance with one or more embodiments of the present invention.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

Figure 1:
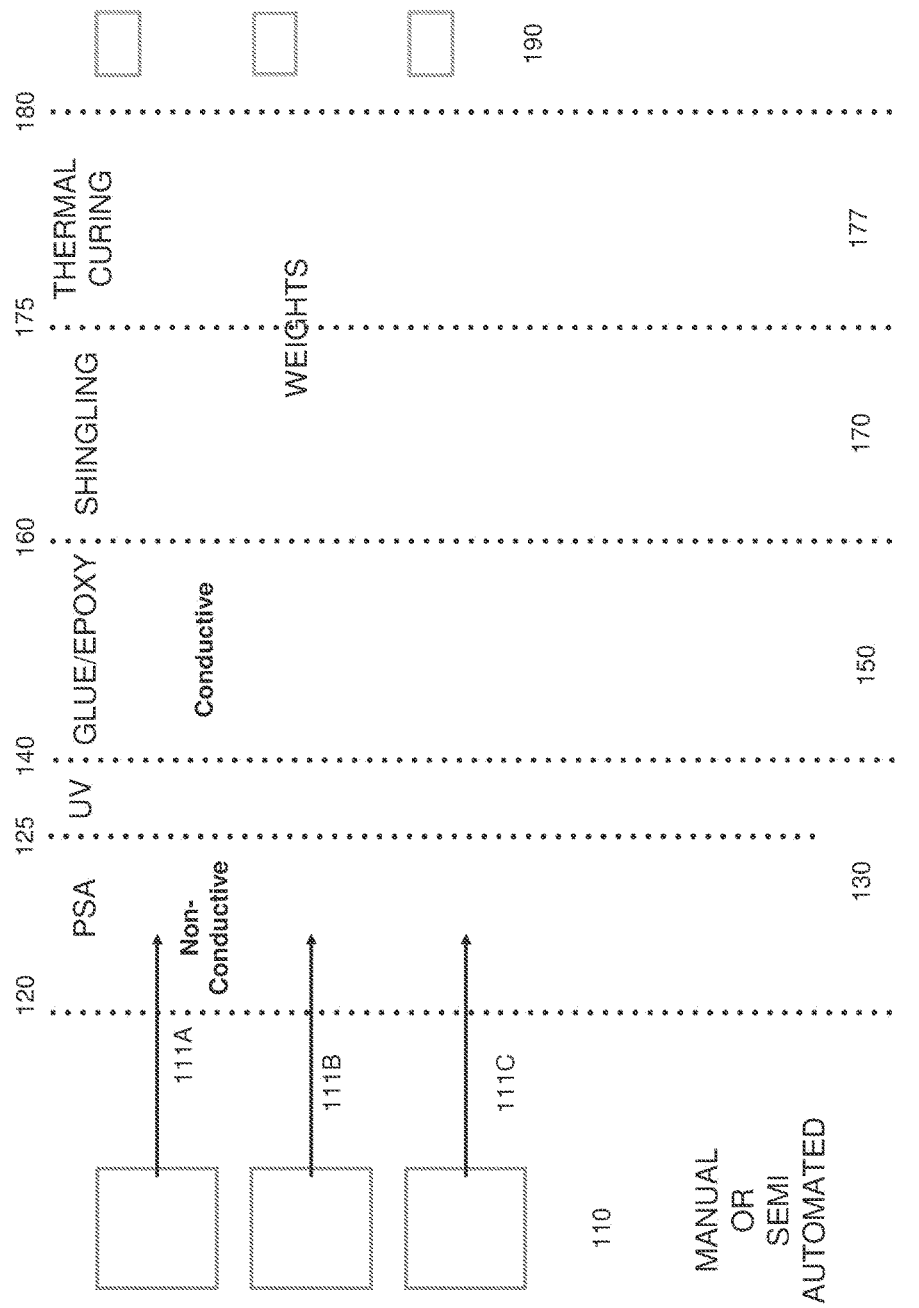
FIG. 1 diagrams illustratively an approach for processing photovoltaic cells.

FIG. 1 diagrams illustratively an approach 100 for processing photovoltaic cells. From FIG. 1, a series of stacked cells 110 is located at the source of the approach 100 where each cell component is stacked in position to be processed in accordance with one of three processing lanes, 111a, 111b and 111c. Typically, the stacked cell components may be manually removed from the stacking and placed on a moving conveyor for processing. The stacked cells are often referred to as a 'coin stack' due to their physical arrangement. Human intervention is often necessitated due to the possibility of damage to the cells and the difficulty of the alignment of sensitive components by automated devices. Human intervention is also often necessitated as the cells are typically sticky or may have other material surface issues that require additional care in separating out the individual cells from one another in the coin stack. In certain situations, some automated equipment may be used in a limited manner though it should be realized that this process is typically a low speed process resulting in less than 10 parts per hour.

Once the components are aligned, the process proceeds to 120. At 120, the cells are prepared for pressure sensitive adhesion (PSA) step. The PSA step 130 may involve application of a pressure sensitive adhesive which when the component is placed into contact with another component or material, creates a bond wherein each of the two parts are securely affixed to one another. Once the PSA step is completed, the cells move to 125 for UV curing which may comprise curing using ultra-violet (UV) light (i.e., UV-cure tunnel).

At 140, the cells then move to a gluing step at 150. In some situations, one side of a cell may have adhesive applied to it, in other situations, adhesive may be applied to one or more component parts. Glue may be applied by hand or by equipment though the latter is often difficult. Once a gluing step is completed, the cells move to a shingling step 160.

At shingling step 160, the cells are coupled together through preferably a shingling process 170. The shingling process involves connecting the photovoltaic cells together. Examples of this process are described in U.S. application Ser. No. 13/397,487 which is assigned to the assignee of this application and incorporated in its entirety herein.

It is typical to place weights or apply other physical devices, such as rollers, to at least one of the component portions in order to create a secure bond between the two components. Using weights at 175, while typical, creates additional risks as the use of weights may cause sensitive components to be damaged or require further hardware replacement during operations which may be difficult or expensive. Alternatively, it is also known to use clamps to achieve a similar effect.

At 175, the cells are prepared for the curing step. The curing step 177 may involve ovens, and other thermal or light-based processes. Once the curing step is completed, the cell then moves to 180. At 180, the processing is completed for the affected photovoltaic cell and the completed photovoltaic cell results at 190.

As used herein, the term 'components' and 'materials' may include Gallium Arsenide (GaAs) based components or other photovoltaic components such as photovoltaic cells for example, flexible, thin-film photovoltaic devices comprising semiconductor material, which may or may not be single-crystal, including but not limited to Group III-V materials such as GaAs, AlGaAs, InGaAs, AlInGaAs, InGaAsP, InGaP, AlInGaP, and AlInP (and combinations thereof); Group IV materials such as Si, amorphous Si, Ge, SiGe; Group II-VI materials such as CdTe; other materials such as CIGS (Copper indium gallium (di)selenide), perovskites such as lead halides, organic semiconductors, CZTS, CZTSSe, and dye-sensitized photovoltaic absorber materials, and will typically be layered arrangements of materials which have one or more interface layers that promote a fixed arrangement as between the material layers following a processing sequence.

Examples of such materials, without limitation, may include photovoltaic cells, solar cells, solar panels, layered plastic components, electronic components, high density interconnects, chips, chips on flex, mixed composition materials having multiple layers arranged to be securely arranged with one another, and combinations thereof, for instance.

FIGS. 2A and 2B diagram a flexible tape feeder 210 having a plurality of photovoltaic cells 220 in connectable arrangement with the tape base 215, in accordance with one or more embodiments of the present invention. The tape feeder, or tape carrier, provides a source of components to be fed into the assembly or process of the present invention.

The flexible tape feeder also provides a flexible backing to flexible cells to be assembled thereby reducing damage to the cells during feeding process. The use of the tape feeder is preferred over the coin stacking method as the tape feeder provides a reuse aspect, is more protective of the sensitive components arranged thereon, and is more efficient in the assembly operation. In an embodiment, the flexible tape feeder comprises any of polyethylene terephthalate (PET), porous materials including paper, cloth and a combination thereof.

Traditional operations use a coin stacking approach which requires a larger footprint in the assembly process and also does not protectably secure the sensitive devices to be processed. The tape feeder profiles a linear flexible base 215 in which sensitive components 220 may be situated, protectively, for processing in the assembly process. The flexible base is of a linear shape when opened and forms a roll when rolled. Alternatively, the flexible base is of a linear shape when under taught tension and retracts to a coil shape when tension to the base is absent.

In an embodiment, the linear base of the tape feeder at 230 may be arranged to provide for a coiling capability 235 where once a tape is populated with a plurality of sensitive components 240, the tape may be wound into the shape of a coil or roll. The coiled tape may then be placed at the beginning of the assembly process whereafter humans and/or robots may readily access the sensitive components situated thereon, removing them for processing. As the tape is fed for the process, the coiled arrangement requires less space and the tape may be rolled into a reusable stock tape during the process as each component is removed.

Figure 2D:
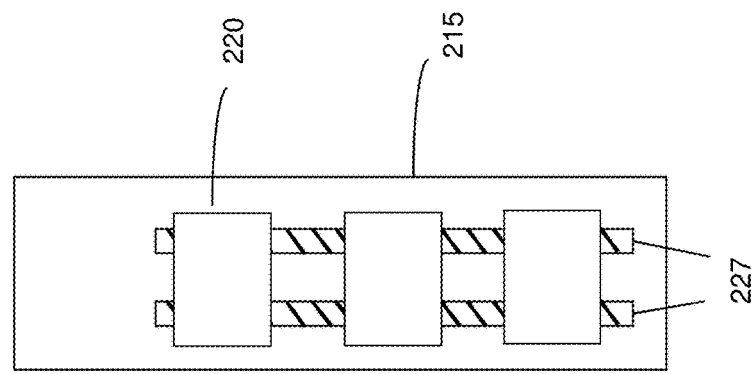
FIGS. 2C and 2D depict two methods for holding the photovoltaic cells in the tape feeder.
Figure 2C:
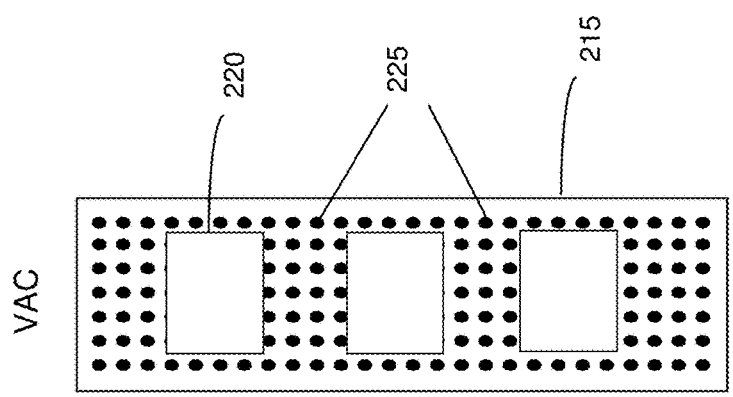

In an embodiment, a width of the flexible base is approximately similar to a size of the photovoltaic cells. In one or more preferred arrangements, instead of a few active lines of processing from traditional stacked cell arrangements involving trays, coin stacking and the like, the present invention provides for a six lane processing arrangement using only three tape rolls of components in which a single tape roll can be used to feed a plurality of active processing lanes. In this manner, the use of the tape feeder of the present invention also promotes a higher speed operation over the traditional approach. The photovoltaic cells can be carried by the tape feeder in a variety of ways. FIGS. 2C and 2D depicts two methods for holding the photovoltaic cells in the tape feeder. In a first embodiment shown in FIG. 2C a vacuum is applied through the openings 225 in the linear base 215 to hold the photovoltaic cells 220 in place.

In a second embodiment shown in FIG. 2D adhesive strips 227 on the linear base 215 are utilized to hold the photovoltaic cells 220 in place. One of ordinary skill in the art readily recognizes that either of or both of the methods together can be utilized to hold the photovoltaic cells 220 in place. For example, in one embodiment, the linear base can use a combination of strategically placed openings 225 and strategically placed adhesive strips 227 and that would be within the spirit and scope of the present invention. In an alternate embodiment, various other materials such as but not limited to adhesive pads, adhesive tape, glue, PSA, a mechanism to hold the photovoltaic cells in place or a combination of such materials/mechanisms can be used to hold the photovoltaic cells in place.

Figure 3:
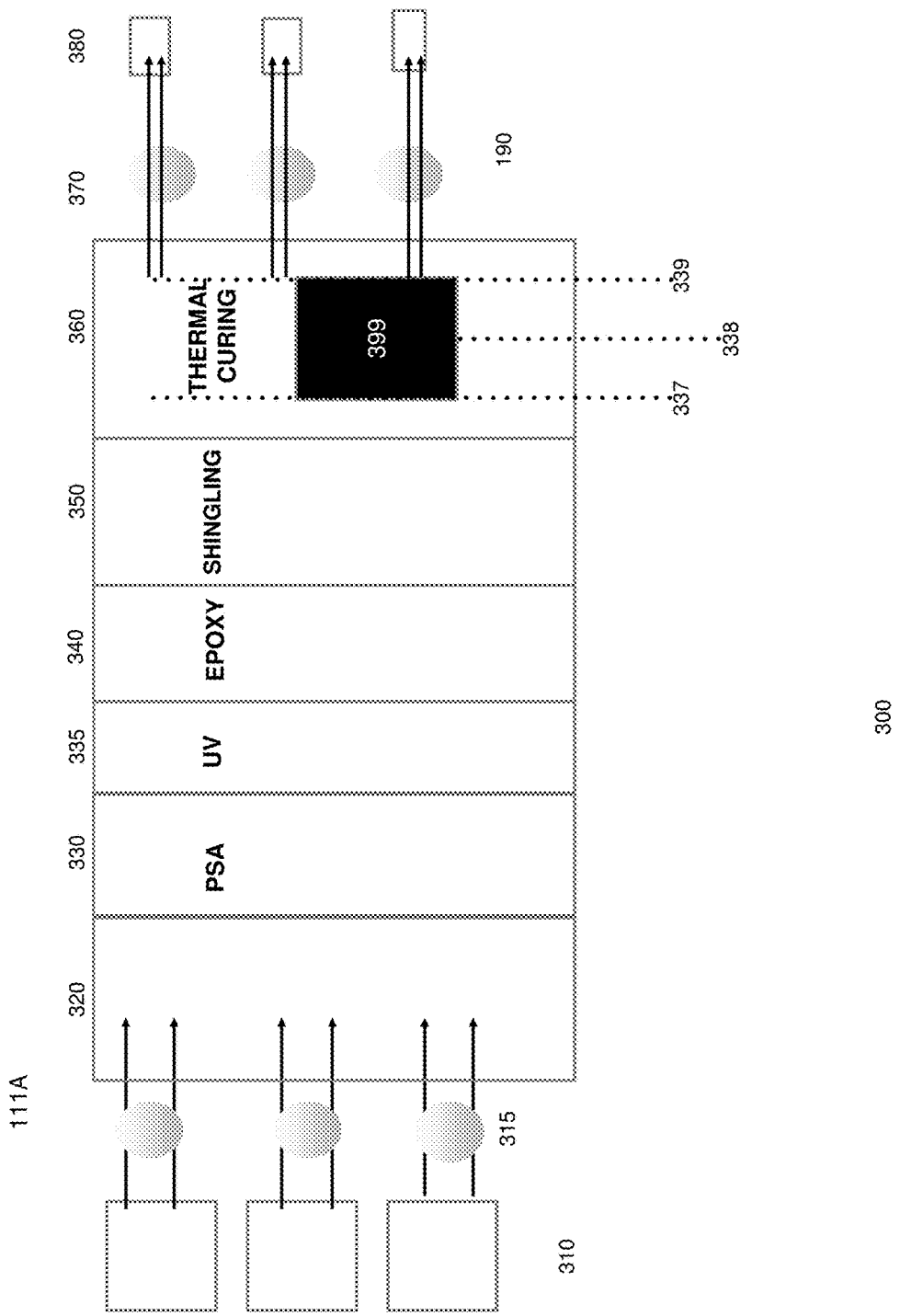
FIG. 3 diagrams a method of processing photovoltaic cells in accordance with one or more embodiments of the present invention.

FIG. 3 diagrams a method 300 of processing photovoltaic cells in accordance with one or more embodiments of the present invention. A tape feeder, described above, is situated at the beginning of a preferred assembly method at 310 as shown in FIG. 3. Preferably, automated equipment 315 removes the sensitive components (or materials) situated on the tape feeder and places them in a predetermined arrangement on the conveyor for processing at 320 corresponding to element 111A shown in FIG. 1. In one or more preferred embodiments, the automated equipment may stack two components that are to be securely arranged together atop one another, next to one another, or proximate to one another. The components are then prepped for the next phase of processing, which for exemplary purposes of FIG. 3 is a phase of receiving a PSA treatment at 330. At 330, the components are prepared and are arranged in layered form with an adhesive based interface between the arranged components as a layered component. The PSA step 330 may involve application of a pressure sensitive adhesive which when the component is placed into contact with another component or material, creates a bond wherein each of the two parts are securely affixed to one another. Once the PSA step is completed, the cells then move to 335 for UV curing which may comprise curing using ultra-violet (UV) light (i.e., UV-cure tunnel).

At 340, conductive epoxy, for example, is placed on one or more sides of at least one component to be processed and the components are arranged before the next step of shingling the components.

Thereafter the prepared photovoltaic cells are coupled together via shingling process 350. In one or more embodiments of the present invention, the next phase is a curing step in which an oven, conventional oven, convection oven, lamp-based source, or thermal source is used, though other possibilities are envisioned by the present invention. Curing could also be done by other methods, including but not limited to UV exposure, or evaporation of the solvent in air or in a vacuum, for example.

The layered component is then conveyed along a conveyor for thermal curing without the use of physical pressure plates or devices, in accordance with one or more preferred embodiments of the present invention. At 360, the layered component will traverse from a first location 337 to a second location 338 where at the second location the upper portion of the layered component will be under pressure from a surface of a moving belt in adaptable contact with the upper portion.

At the first location 337, the layered component is situated on the conveyor which in one or more preferred embodiments is a vacuum conveyor having a plurality of openings therein. Preferably the vacuum conveyor is also comprised of a durable material that provides rigidity and flexibility under pressure, such as being at least partly comprised of metal (SST, Al, etc.), high temp plastic, ceramic, granite, etc. As the layered material traverses from the first location to the second location, in an embodiment, a moving belt is situated above the conveyor and above the layered component. In an embodiment, the moving belt can be an idler belt or a driven belt situated above the conveyor and above the layered component. In an embodiment, the moving belt is not in contact with the layered component at the first location 337 but is in contact with the layered component at approximately the second location 338 and for a period of travel proximate thereto depending on the physical arrangement in one or more preferred embodiments. A pressure source, such as an air pump, vacuum pump, or pressurized air flow is positioned proximate to the idler belt or the driven belt and is adaptable and adjustable to control the flow of air from the air source to and across the idler belt or the driven belt and the vacuum conveyor, at 360. In one or more embodiments, a vacuum pump is controlled by a controller in which there are multiple zones of varying pressure between the second location 338 and the third location 339, for example.

At approximately the second location 338, in one or more preferred embodiments, the idler belt is in contact with the upper portion of the layered material. In operation, when no air pressure provided from the air source, the idler belt will be in 'non-pressured' contact with the upper surface of the layered material, resulting in the idler belt rolling at the same speed to that of the layered component due to the friction created. However, in operation, when there is active air pressure provided from the air source, the idler belt will be in 'pressured' contact with the upper surface of the layered material, resulting in the idler belt applying a pressure force to the upper portion of the layered material thereby forcibly pressuring the upper portion onto the lower portion. The rolling speed of the idler belt will act resistively towards the layered material though the speed may approximate a speed similar to that of the layered component due to the friction created. The idler belt will remain in non-pressured or pressured contact with the upper portion of the layered component until the layered component reaches a third location at 339. The user is able to adaptably adjust the amount of pressure a layered component receives based on the air source, the length of contact with the idler belt, and the environmental conditions of the process.

In an embodiment, the movement of the moving belt is controlled in relation to the time and pressure required for cure. Similarly, speed of conveyance of the vacuum conveyor, a speed of operation of the moving belt, a material composition of the vacuum conveyor, a material composition of the moving belt, and a length of travel the vacuum conveyor and the moving belt traverse between the second location and the third location is dependent upon temperature and time required for curing. In an embodiment, the moving belt can be an idler belt or a driven belt situated above the conveyor and above the layered component.

At the third location 339, the layered materials have been situated together based on the pressured or non-pressured contact. Depending on the layered materials of the process, the curing time of phase 360 may differ substantially and may also depend on the user's interest in achieving a full or partial cure for the layered material. For instance, where the layered materials are photovoltaic cells, the method of the present invention provides that approximately one minute per cell matrix would be a reasonable estimate of the curing time required, with a slightly longer time being required if a plurality of matrices is placed in parallel for instance, by example.

After the curing phase at 360, the finished layered components are cooled from the phase of curing at stage 380, via active or passive cooling and are removed preferably by automated equipment at 370 corresponding to element 190 shown in FIG. 1. For clarity, while use of automated equipment is discussed and preferred in certain applications of the present invention, it is not required as the present invention is also capable of being operated without automated equipment and in an arrangement that is partly automated equipment and partly human interaction, without limitation.

Figure 4:
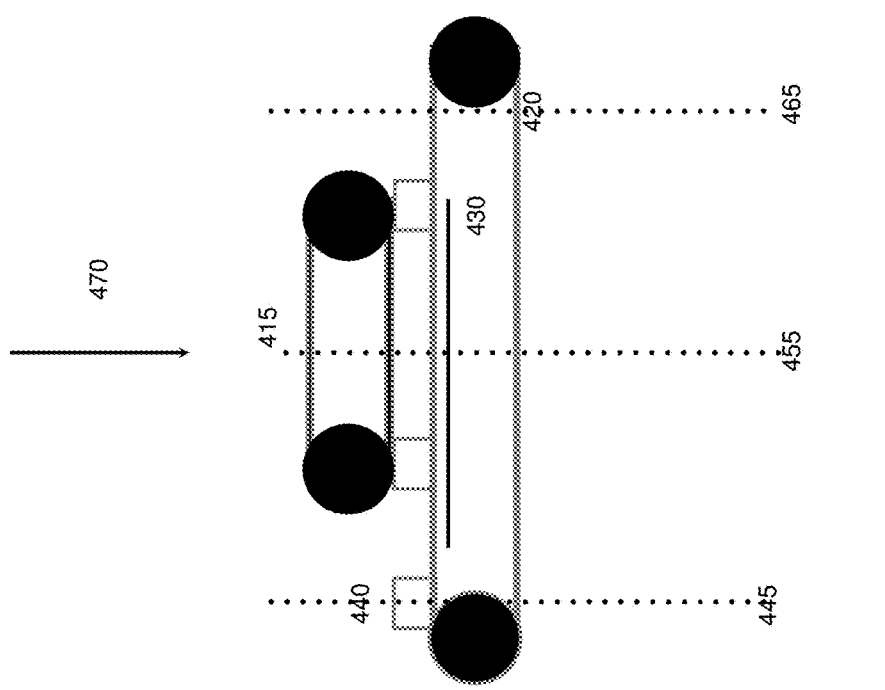
FIG. 4 diagrams a vacuum conveyor and a moving belt in relation arrangement in accordance with one or more embodiments of the present invention.

FIG. 4 diagrams a vacuum conveyor 420 and a moving belt 415 in relational arrangement at 400 in accordance with one or more embodiments of the present invention. In an embodiment, the moving belt can be an idler belt or a driven belt situated above the conveyor and above the layered component. As shown in FIG. 4, a multi-layer component is entering the drive arrangement 400 at 440 at a first location 445. The multi-layer component is situated on the conveyor (i.e., vacuum conveyor) 420 and is conveyed to a second point 455. At the second location 455, the moving belt 415, for example, an idler belt may be situated to be in non-pressurized or pressurized contact with the upper portion of the multi-layered component. After possible contact at the second location 455, the multi-layer component is continued to be conveyed along the vacuum conveyor to a third location 465.

As shown in FIG. 4 the vacuum conveyor 420 and the idler belt 415 may be driven by the same motor drive or controller; in another embodiment, the vacuum conveyor 420 and the idler belt 415 are driven independently. In a preferred arrangement the vacuum conveyor 420 is fabricated from steel. In a further preferred arrangement, a pressure plate is present at 430 which provides additional support to layered components on the surface of the vacuum conveyor 420 during a pressurized air flow 470.

FIG. 5 diagrams a vacuum conveyor 520 and a moving belt 515 in relational arrangement at 500 when under pressure from a vacuum source such as a vacuum pump creating a downward pressure, in accordance with one or more embodiments of the present invention. In an embodiment, the moving belt can be an idler belt or a driven belt situated above the conveyor and above the layered component. As shown in FIG. 5, a multi-layer component 540 is entering the drive arrangement 510 at a first location 545. The multi-layer component 540 is situated on the conveyor system (i.e. vacuum conveyor) 520 and is conveyed to a second location at 555. At the second location, the idler belt 515, in the example, is under pressure from a vacuum pump creating a pressurized force downwards such that the upper portion of the multi-layered component 540 is in contact with the idler belt 515. As the multi-layered component 540 is conveyed from the second location 555, the idler belt 515 applies pressure to the upper portion and the upper portion is compressed onto the lower portion which continues to ride along the vacuum conveyor 520 above a reinforcing plate preferably situated at 575, between the second location 555 and the third location 565. The force of the pressure may be adjusted by varying the vacuum pump, etc. After contact at the second location 555 and thereafter, the multi-layer component 540 is continued to be conveyed along the vacuum conveyor to the third location 565 where the contact to the upper portion from the idler belt 515 ceases and the compressed multi-layered component 540 is at a final stage at 580.

In an embodiment, the top of the arrangement 500 is heated by a tunnel oven 590 while the bottom of the arrangement 500 may either be heated, unheated or actively cooled as required by the process. In such an embodiment, temperature may be used to also facilitate the pressure adhesion process using the present invention.

In operation, in accordance with one embodiment, when there is no air pressure provided from the air source (or vacuum source), the idler belt will be in 'non-pressured' contact with the upper surface of the layered material, resulting in the idler belt rolling at a speed approximately similar to that of the layered component due to the friction created. In another embodiment, the idler belt is in adjustable contact with the upper portion based upon physical arrangement and air source pressure such that there is no contact with the upper portion absent an air source.

In an embodiment, the movement of the moving belt is controlled in relation to the time and pressure required for cure. Similarly, speed of conveyance of the vacuum conveyor, a speed of operation of the moving belt, a material composition of the vacuum conveyor, a material composition of the moving belt, and a length of travel the vacuum conveyor and the moving belt traverse between the second location and the third location is dependent upon temperature and time required for curing. In an embodiment, the moving belt can be an idler belt or a driven belt situated above the conveyor and above the layered component.

As is apparent from the above description, the present invention is able to achieve significant benefits in the area without the use of weights, clamps and rollers, or other physical devices which add additional wear and create potential damage to sensitive components being processed. Further the process is able to recognize improved throughput and speed in processing and further facilitates the deployment of automated equipment into environments that may be dangerous for human intervention.

Finally, it is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

What is claimed is:

1. A method for connecting a plurality of materials comprising:
    receiving the plurality of materials on a vacuum conveyor at a first location, wherein the vacuum conveyor includes a plurality of openings through which a vacuum is applied to hold the plurality of materials in place on the vacuum conveyor;
    conveying the received plurality of materials from the first location to a second location along the vacuum conveyor, wherein a moving belt is adaptively positioned above the vacuum conveyor at the second location, and wherein the vacuum conveyor and the moving belt are arranged to be driven in a predetermined relation to one another; and
    applying a predetermined vacuum through at least one of the plurality of openings to cause the moving belt to apply a pressure to an upper surface of the plurality of materials as the plurality of materials are conveyed from the second location to a third location, wherein the pressure creates a force that compresses the plurality of materials; and
    curing the compressed plurality of materials.

2. The method of claim 1, wherein the moving belt comprises any of an idler belt or a driven belt.

3. The method of claim 2, wherein the plurality of materials comprise at least an upper portion and a lower portion arranged to be layered with the upper portion atop the lower portion.

4. The method of claim 3, wherein at least one of the upper portion or the lower portion includes one or more of an adhesive, epoxy, or securing material for securably affixing the upper portion and the lower portion to one another during the step of compressing.

5. The method of claim 3, wherein the second location is a start of a curing step in a manufacturing assembly.

6. The method of claim 3, wherein the vacuum conveyor is relationally arranged with the moving belt and a supporting plate is positioned beneath an upper conveying portion of the vacuum conveyor for additional support in conveying.

7. The method of claim 3, wherein the moving belt and the vacuum conveyor are operatively controlled by one or more controllers in relation to one another.

8. The method of claim 7, wherein the moving belt and the vacuum conveyor are an integrated unit and a drive is common to the vacuum conveyor and the moving belt.

9. The method of claim 8, wherein the common drive is driven by a plurality of gears adaptively arranged.

10. The method of claim 9, wherein the moving belt freely moves.

11. The method of claim 9, wherein the moving belt is driven to control movement in relation to the time and pressure required for cure.

12. The method of claim 9, wherein a speed of conveyance of the vacuum conveyor, a speed of operation of the moving belt, a material composition of the vacuum conveyor, a material composition of the moving belt, and a length of travel the vacuum conveyor and the moving belt traverse between the second location and the third location is dependent upon temperature and time required for thermal curing of the plurality of materials.

13. The method of claim 2, wherein the plurality of materials comprise one or more materials from the group comprising: Group III-V materials; Group IV materials; Group II-VI materials; Copper indium gallium (di)selenide (CIGS), perovskites, organic semiconductors, CZTS, CZTSSe, and dye-sensitized photovoltaic absorber materials.

14. The method of claim 13, wherein the Group III-V materials further comprise any of GaAs, AlGaAs, InGaAs, AlInGaAs, InGaAsP, InGaP, AlInGaP, AlInP and a combination thereof.

15. The method of claim 13, wherein the Group IV materials further comprise any of Si, amorphous Si, Ge, SiGe and a combination thereof.

16. The method of claim 13, wherein the Group II-VI materials further comprise CdTe.

17. The method of claim 13, wherein the perovskites comprise lead halides.

18. The method of claim 13, wherein the plurality of materials comprise one or more photovoltaic cells which are aligned in a matrix.

19. The method of claim 3, wherein the second location is related to a thermal curing step further comprising a thermal source.

20. The method of claim 19, wherein the thermal source is one or more of a conventional oven, a convection oven, a lamp-based thermal source, or a resistive heat source.

21. The method of claim 3, further comprising the step of producing a layered material having the upper portion and the lower portion fixably arranged and compressed under pressure with one another.

22. The method of claim 21, wherein the produced layered material is a finished photovoltaic cell.

23. A system for connecting a plurality of materials comprising:
    a vacuum conveyor for receiving the plurality of materials at a first location, wherein the vacuum conveyor includes a plurality of openings through which a vacuum is applied to hold the plurality of materials in place on the vacuum conveyor;
    a moving belt adaptively positioned above the vacuum conveyor at a second location, wherein the vacuum conveyor and the moving belt are arranged to be driven in a predetermined relation to one another for conveying the received plurality of materials from the first location to the second location along the vacuum conveyor;

a vacuum source for applying a predetermined vacuum through at least one of the plurality of openings to cause the moving belt to apply a pressure to an upper surface of the plurality of materials as the plurality of materials are conveyed from the second location to a third location, wherein the pressure creates a force that compresses the plurality of materials; and a curing source at the second location for curing the compressed plurality of materials.

24. The system of claim 23, wherein the moving belt comprises any of an idler belt or a driven belt.

25. The system of claim 24, wherein the plurality of materials comprises at least an upper portion and a lower portion arranged to be layered with the upper portion atop the lower portion.

26. The system of claim 25, wherein at least one of the upper portion or the lower portion includes one or more of an adhesive, epoxy, or securing material for securably affixing the upper portion and the lower portion to one another during the step of compressing.

27. The system of claim 25, wherein the second location is a start of a curing step in a manufacturing assembly.

28. The system of claim 25, wherein the vacuum conveyor is relationally arranged with the moving belt and a supporting plate is positioned beneath an upper conveying portion of the vacuum conveyor for additional support in conveying.

29. The system of claim 25, wherein the moving belt and the vacuum conveyor are operatively controlled by one or more controllers in relation to one another.

30. The system of claim 29, wherein the moving belt and the vacuum conveyor are an integrated unit and a drive is common to the vacuum conveyor and the moving belt.

31. The system of claim 30, wherein the common drive is driven by a plurality of gears adaptively arranged.

32. The system of claim 31, wherein the moving belt freely moves.

33. The system of claim 31, wherein the moving belt is driven to control movement in relation to the time and pressure required for cure.

34. The system of claim 31, wherein a speed of conveyance of the vacuum conveyor, a speed of operation of the moving belt, a material composition of the vacuum conveyor, a material composition of the moving belt, and a length of travel the vacuum conveyor and the moving belt traverse between the second location and the third location is dependent upon temperature and time required for curing of the plurality of materials.

35. The system of claim 23, wherein the plurality of materials comprise one or more materials from the group comprising: Group III-V materials; Group IV materials; Group II-VI materials; Copper indium gallium (di)selenide (CIGS), perovskites, organic semiconductors, CZTS, CZTSSe, and dye-sensitized photovoltaic absorber materials.

36. The method of claim 23, wherein the Group III-V materials further comprise any of GaAs, AlGaAs, InGaAs, AlInGaAs, InGaAsP, InGaP, AlInGaP, AlInP and a combination thereof.

37. The method of claim 23, wherein the Group IV materials further comprise any of Si, amorphous Si, Ge, SiGe and a combination thereof.

38. The method of claim 23, wherein the Group II-VI materials further comprise CdTe.

39. The method of claim 23, wherein the perovskites comprise lead halides.

40. The system of claim 35, wherein the plurality of materials comprises one or more of photovoltaic cells which are aligned in a matrix.

41. The system of claim 23, wherein the second location is related to a thermal curing step further comprising a thermal source.

42. The system of claim 41, wherein the thermal source is one or more of a conventional oven, a convection oven, a lamp-based thermal source, or a resistive heat source.

43. The system of claim 25, further comprising the step of producing a layered material having the upper portion and the lower portion fixably arranged and compressed under pressure with one another.

44. The system of claim 43, wherein the produced layered material is a finished photovoltaic cell.

* * * * *